United States Patent [19]
Riermeier et al.

[11] Patent Number: 5,268,038
[45] Date of Patent: Dec. 7, 1993

[54] ELECTRICAL TERMINAL ELEMENT FOR SOLAR MODULES

[75] Inventors: Manfred Riermeier, Oberneuching; Gerhard Zinke; Adolf Muenzer, both of Munich, all of Fed. Rep. of Germany

[73] Assignee: Siemens Solar GmbH, Munich

[21] Appl. No.: 899,802

[22] Filed: Jun. 17, 1992

[30] Foreign Application Priority Data

Jul. 5, 1991 [EP] European Pat. Off. ........ 91111242.3

[51] Int. Cl.⁵ ................ H01L 31/048; H01L 31/05
[52] U.S. Cl. ................................................ 136/251
[58] Field of Search .................................... 136/251

[56] References Cited

U.S. PATENT DOCUMENTS

| | | | |
|---|---|---|---|
| 4,239,555 | 12/1980 | Scharlack et al. | 136/251 |
| 4,371,739 | 2/1983 | Lewis et al. | 136/251 |
| 4,433,200 | 2/1984 | Jester et al. | 136/251 |
| 5,110,369 | 5/1992 | Tornstrom et al. | 136/251 |

FOREIGN PATENT DOCUMENTS

2942328A1  4/1981  Fed. Rep. of Germany.

OTHER PUBLICATIONS

Patent Abstracts of Japan, Publication Date Jun. 10, 1982, Kita Yuutarou et al, "Solar Battery Module" JP 57-162473.

Patent Abstracts of Japan, Publication Date Mar. 14, 1983, Takada Mitsuru et al, "Solar Battery Module" JP 58-043580.

*Primary Examiner*—Aaron Weisstuch
*Attorney, Agent, or Firm*—Hill, Steadman & Simpson

[57] ABSTRACT

A simple connection for a solar cell module is composed of a soldered-on, stud-shaped terminal element that is fixed with a retainer element plugged thereover and glued to the back side of the solar module. The projection of the end of the terminal element comprises a connection for a cable.

12 Claims, 2 Drawing Sheets

ELECTRICAL TERMINAL ELEMENT FOR SOLAR MODULES

BACKGROUND OF THE INVENTION

Solar cell modules are essentially composed of a substrate on which a plurality of strip-shaped or wafer-shaped solar cells are arranged and are electrically connected to one another. The solar cells are embedded in a plastic material for protection against meteorological influences. A glass pane can serve as a substrate at the front side of this composite. The back side of the composite can be protected by a special, additional composite film, or by a second glass pane. For improved manipulation, for fastening, and for enhancing the resistance to breakage, a standard frame composed of metal can also be provided.

Electrical terminals are provided for outputting the current produced when sunlight is incident on the solar cells, or for interconnecting a plurality of solar modules. These electrical terminals, for example, can be terminal boxes secured to the module in an inside of which the corresponding terminals are provided in the form of binding posts or studs. Studs permanently mounted to the frame or connecting cables permanently integrated in the module are also known, for example, as other connection possibilities.

What is disadvantageous about known electrical terminals for solar modules is their relatively great expense for material and manufacture, which can represent a considerable cost factor in the overall solar module.

SUMMARY OF THE INVENTION

It is therefore an object of the present invention to provide a solar module with an electrical terminal that is simple to manufacture and also guarantees a simple, fast, and reliable interconnection.

This object is achieved according to the invention by a solar module that comprises at least two electrical terminals, each of which is composed of a stud-like terminal element that is fixed with the assistance of a retainer element plugged thereover and glued to the back side of the module. The retainer element may be composed of plastic.

The electrical terminal for the solar module of the invention can be simply attached to any desired location of the module. The retainer element insures a reliable fastening of the terminal element since it partially surrounds the latter, and its broadened foot offers an adequate seating surface for reliable gluing to the module. The terminal element itself need only be soldered to the conductor strips that must be conducted to a location at the back side of the module for that purpose. The retainer element comprises a central bore matched to the stud-shaped terminal element, so that a good grip of the terminal element, even without gluing, is already guaranteed by plugging the retainer element on. A retainer element fabricated of plastic is electrically insulating at the same time and, given suitable gluing, seals the opening in the laminated solar module that is required for the electrical connection.

Another advantageous embodiment of the invention provides an at least partially-hollow retainer element whose cavities are filled with adhesive during gluing, so that an especially tight and reliable fastening of the terminal element at the module is guaranteed.

It is provided in a further embodiment of the invention to integrate a protective diode in the electrical terminal. For example, the protective diode can be soldered to the terminal element and can be reliably covered under the retainer element.

The terminal element is stud-shaped and can comprise a circular, polygonal, or circular arc-shaped cross section. A noncircular cross section provides a more reliable grip of a correspondingly shaped retainer element, so that a tear-off of the terminal element, for example as a result of twisting away from the solder location, is avoided.

In its upper part projecting from the retainer element, the terminal element comprises a design that is suitable for simple and reliable connection of a connecting cable. For example, the terminal element can comprise a thread at its upper part, so that an electrical connection can be accomplished with the assistance of a cable bracket, union nuts, and spring washers. A further possibility of connection is established when the terminal element is designed as a clamp connector at its upper part. It is also possible to provide the electrical connection via a plug-type connector, whereby the terminal element is designed as a socket or plug. It is also possible to produce the electrical connection via a combination of connectors, for example via a plug-type connector that is secured with an additional screw-type connector.

A further development of the invention is directed to a means for protecting the electrical terminal against moisture and precipitation. After providing an electrical connector at the terminal, for example, it can be covered or sealed with a protective battery cap or with a similar device. The protective cap is suitable for being plugged onto the retainer element, so that the terminal element or the electrical terminal is covered under the protective cap. The protective cap can be part of the connecting cable whose end provided for connection to the terminal element passes into and terminates in the inside of the protective cap.

Devices for latching the protective cap, for example a recess or a corresponding projection, can be provided at those sides of the retainer element facing away from the terminal element for the purpose of a reliable fastening of the protective cap on the retainer element. A recess or projection can be designed to extend continuously over the entire circumference of the retainer element and thus represent an annular slot or bead. When the retainer element or protective cap are appropriately elastic, an adequately water-tight and well-fitting covering of the electrical terminal can thus be produced.

In one embodiment of the invention, a plurality of electrical terminals can be provided side-by-side. It is thereby possible to provide a common retainer element for two terminal elements. It must merely be assured that the electrical terminals can be manufactured separately from one another.

At least two electrical terminals must be provided per module. However, it is possible to provide at least one further terminal with the assistance of which a voltage lower than the maximum voltage can be outputted at the module.

DESCRIPTION OF THE PREFERRED EMBODIMENTS

Figure 1:
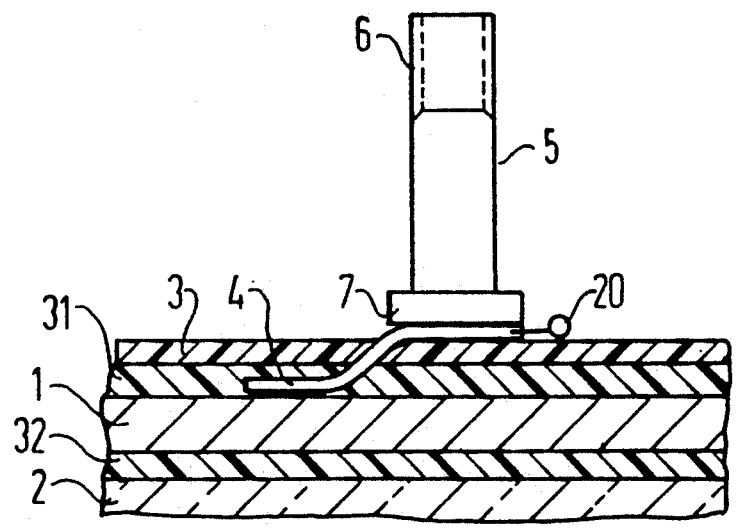
FIGS. 1 and 2 show the electrical terminal of a solar module in schematic cross section.

As shown in FIG. 1, the solar module is composed of a plurality of crystalline solar cells 1 that are embedded between plastic films 31, 32. A glass pane serves as a substrate 2 at the front side. Protection at the back side is provided by a multilayer composite film 3. For example, the solar cells 1 are electrically interconnected by conductor ribbons 4 that are soldered on. At at least two locations of the module, the conductor ribbons or strips 4 are guided onto the back side of the module through the covering composite film 3. A terminal element 5 is then soldered to these ends of the conductor ribbons or strips 4. This terminal element 5, for example, has the shape of a cylinder, can have a broadened base 7, and its upper end can comprise a thread 6. The figure shows a terminal element 5 that has been soldered on, and also shows a protective diode 20 next to it that has likewise been soldered on.

Figure 2:
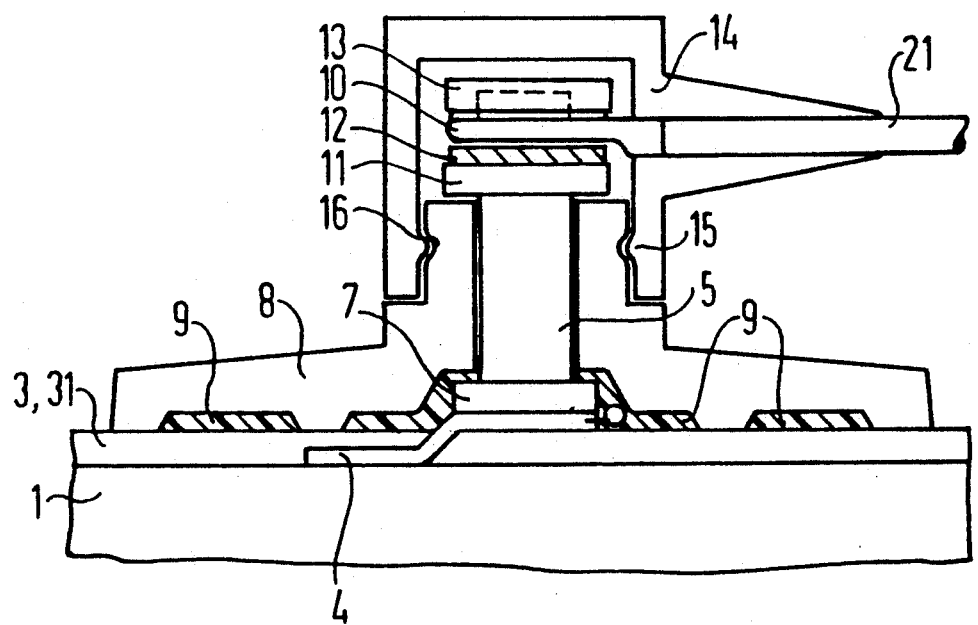

As shown in FIG. 2, a retainer element 8 composed of plastic is fitted over the terminal element 5, this retainer element 8 comprising a passage shaped in conformity with the terminal element 5 for this purpose. Advantageously, the retainer element 8 is broadened at its foot, as shown, in order to assure a reliable seating surface on the solar module. It has its greatest height around the terminal element 5 in order to provide the latter a reliable grip. The seating surface of the retainer element can be designed in planar fashion, as shown, and can have various recesses that are filled up with adhesive 9 when glued onto the back side of the solar module. In the exemplary embodiment, the retainer element 8 is formed of polycarbonate and is glued on the composite film 3 with a silicone adhesive.

An electrical connection is shown being produced in FIG. 2 with the assistance of a connecting cable 21. The latter ends in a cable eyelet 10 that is placed over that part of the terminal element projecting from the retainer element 8. It is secured thereat between a first, screwed-on counternut 11, a spring washer 12, and another, screwed-on union nut 13. The protective cell cap 14, which is connected to the connecting cable 21 and can be plugged onto the retainer element 8, is only schematically shown. A projection 15 at the lower end of the cell cap can engage into a recess 16 of the retainer element 8 and can thus be reliably connected thereto. The electrical terminal is thus covered in water-tight fashion by the protective cell cap 14 that is composed, for example, of hard rubber.

Figure 3:
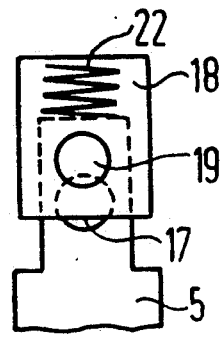
FIGS. 3 and 4 show various embodiments of the terminal element, likewise in schematic cross section.

FIG. 3 shows another version of a terminal element 5 whose upper end comprises a clamp connection for connection of a cable. This is essentially composed of a bore 17 transverse to the axis of the terminal element 5 and a sleeve 18 inverted over the terminal element 5 and having an identical bore 19. The sleeve 18 is displaceable on the terminal element 5 to at least such an extent that the bores 17 and 19 completely overlap in the one position, whereas there is only a slight overlap of the two bores in the other position. A spring 22 can fix the sleeve 18 in the latter position. The sleeve 18 is then displaced to such an extent opposite the spring pressure that a connecting cable can be conducted through the bores that now overlap. After relieving the spring 22, the sleeve 18 dislocates again, so that the cable end is fixed between the bores of sleeve and terminal element 5 that now no longer completely overlap. The sleeve 18 can be fixed in this position by a nut (not shown) screwed onto the terminal element 5. The spring can thereby also be omitted as warranted.

Figure 4:
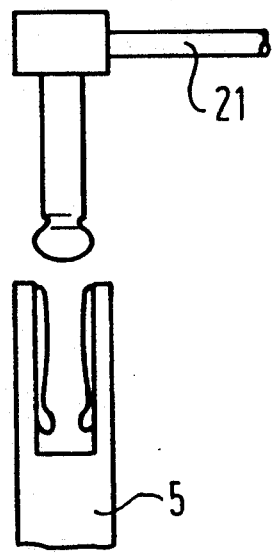

FIG. 4 shows the upper end of a terminal element 5 designed as a plug socket, and also shows a connecting cable provided with a corresponding plug.

Although various minor changes and modifications might be proposed by those skilled in the art, it will be understood that we wish to include within the claims of the patent warranted hereon all such changes and modifications as reasonably come within our contribution to the art.

We claim as our invention:

1. A solar module, comprising:
   a plurality of interconnected solar cells;
   a protective film covering a back side of the solar cells;
   at least one electrical terminal comprising a stud-shaped terminal element mounted at said back side on an outer surface of said film facing away from said solar cells;
   a conductor having one end connecting to the at least one terminal element, passing through the film, and having its other end connecting to the solar cells;
   at least one plastic retainer element means for fixing the at least one stud-shaped terminal element to the film at the back side of the solar cells, said retainer element means being adhesively fixed to said outer surface of said film at said back side, and said retainer element means being fitted over the corresponding stud-shaped terminal element;
   said at least one retainer element means being at least partially hollow at a foot portion thereof so as to create cavities which are filled by an adhesive; and
   a protective diode integrated in said at least one electrical terminal.

2. A solar module according to claim 1 wherein a part of the at least one terminal element projects beyond the at least one retainer element means.

3. A solar module according to claim 2 wherein said part of the terminal element projecting beyond the retainer element means has a plug-type connector.

4. A solar module according to claim 2 wherein said part of the terminal element projecting beyond the retainer element means comprises a clamp mechanism.

5. A solar module according to claim 2 wherein a part of the at least one terminal element which projects beyond the at least one retainer element means has a thread.

6. A solar module according to claim 1 wherein said retainer element means has a portion extending away from said film at said back side, and has engagement means for engagement of a further part plugged thereover and onto the retainer element means.

7. A solar module according to claim 6 wherein said engagement means comprises a recess.

8. A solar module according to claim 6 wherein said engagement means comprises a projection.

9. A solar module according to claim 6 wherein said further part comprises a protective cap receivable over a narrowed end portion of said retainer element means projecting away from said film at said back side and having a hollow interior in which an end of said stud-shaped terminal element is positioned, and wherein retainer means for retaining a connecting cable on said terminal element is provided within said hollow interior within said cap, and wherein said connecting cable enters through an aperture in said cap to said stud-shaped terminal element.

10. A solar module according to claim 1 wherein said retainer element means is common to at least two terminal elements.

11. A solar module according to claim 1 wherein each stud-shaped terminal element has a separate retainer element means associated therewith which is plugged thereover.

12. A solar module according to claim 1 wherein said conductor has its one end directly adjacent the terminal element and then passes at an angle through the protective film covering where it connects at its other end to the solar cell at a laterally offset location laterally offset from the stud-shaped terminal element.

* * * * *